United States Patent
Na et al.

(10) Patent No.: US 9,653,132 B2
(45) Date of Patent: May 16, 2017

(54) SEMICONDUCTOR PACKAGES USABLE WITH SEMICONDUCTOR CHIPS HAVING DIFFERENT PAD ARRANGEMENTS AND ELECTRONIC DEVICES HAVING THE SAME

(71) Applicant: SAMSUNG ELECTRONICS CO., LTD., Suwon-si, Gyeonggi-Do (KR)

(72) Inventors: Dae-Hoon Na, Seoul (KR); Hyun-Jin Kim, Hwaseong-si (KR); Jeong-Don Ihm, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/051,896

(22) Filed: Feb. 24, 2016

(65) Prior Publication Data

US 2016/0358655 A1  Dec. 8, 2016

(30) Foreign Application Priority Data

Jun. 3, 2015 (KR) ........................ 10-2015-0078472

(51) Int. Cl.
*G11C 8/12* (2006.01)
*G11C 16/08* (2006.01)
(Continued)

(52) U.S. Cl.
CPC ................ *G11C 8/12* (2013.01); *G11C 5/02* (2013.01); *G11C 5/04* (2013.01); *G11C 5/063* (2013.01); *G11C 16/08* (2013.01); *G11C 16/10* (2013.01); *G11C 16/26* (2013.01); *H01L 23/5256* (2013.01); *H01L 24/06* (2013.01); *H01L 25/0657* (2013.01); *H01L 2225/06506* (2013.01); *H01L 2924/1438* (2013.01)

(58) Field of Classification Search
CPC ................ G11C 5/02; G11C 5/04; G11C 8/12
See application file for complete search history.

(56) References Cited

U.S. PATENT DOCUMENTS 7,099,175 B2    8/2006   Lee et al.
7,200,021 B2 *  4/2007   Raghuram ............. B82Y 10/00
                                                    257/686
(Continued)

FOREIGN PATENT DOCUMENTS

JP    2014-236186 A    12/2014

*Primary Examiner* — Vanthu Nguyen
(74) *Attorney, Agent, or Firm* — Volentine & Whitt, PLLC

(57) ABSTRACT

A semiconductor package includes an external electrode, an interface chip, and a semiconductor chip. The interface chip includes an external interface pad bonded to the external electrode, a plurality of internal interface pads, and an interface circuit coupled between the external interface pad and the plurality of internal interface pads. The semiconductor chip includes a signal pad that is selectively bonded to one of the plurality of internal interface pads. The interface circuit activates a connection between a selected pad, which corresponds to a pad that is bonded to the signal pad among the plurality of internal interface pads, and the external interface pad, and deactivates connections between unselected pads, which correspond to pads that are not bonded to the signal pad among the plurality of internal interface pads, and the external interface pad.

8 Claims, 10 Drawing Sheets

(51) Int. Cl.
*H01L 23/00* (2006.01)
*H01L 25/065* (2006.01)
*G11C 16/10* (2006.01)
*H01L 23/525* (2006.01)
*G11C 5/06* (2006.01)
*G11C 16/26* (2006.01)
*G11C 5/04* (2006.01)
*G11C 5/02* (2006.01)

(56) References Cited

U.S. PATENT DOCUMENTS

| | | | |
|---|---|---|---|
| 7,466,577 B2 * | 12/2008 | Sekiguchi | G11C 5/02 |
| | | | 257/686 |
| 7,693,003 B2 | 4/2010 | Chu | |
| 8,076,766 B2 | 12/2011 | Ikeda et al. | |
| 8,198,915 B2 | 6/2012 | Yoko | |
| 8,593,849 B2 | 11/2013 | Jeddeloh | |
| 8,599,641 B2 | 12/2013 | Yoko et al. | |
| 8,797,822 B2 | 8/2014 | Sato | |
| 8,908,450 B1 * | 12/2014 | Wronski | G11C 11/4076 |
| | | | 365/193 |
| 8,941,246 B2 | 1/2015 | Miura et al. | |
| 2007/0290363 A1 | 12/2007 | Kyung | |
| 2015/0021761 A1 | 1/2015 | Park | |
| 2015/0024554 A1 | 1/2015 | Sapone | |
| 2015/0031149 A1 | 1/2015 | Han et al. | |

* cited by examiner

SEMICONDUCTOR PACKAGES USABLE WITH SEMICONDUCTOR CHIPS HAVING DIFFERENT PAD ARRANGEMENTS AND ELECTRONIC DEVICES HAVING THE SAME

CROSS-REFERENCE TO RELATED APPLICATION(S)

This application claims priority under 35 USC §119 to Korean Patent Application No. 10-2015-0078472, filed on Jun. 3, 2015 in the Korean Intellectual Property Office (KIPO), the contents of which are herein incorporated by reference in their entirety.

BACKGROUND

1. Technical Field

Example embodiments relate to a semiconductor device, and more particularly to a semiconductor package and an electronic device including the semiconductor package.

2. Description of the Related Art

Generally, a semiconductor chip, such as a memory integrated circuit, is provided in the form of a package by connecting pads of the semiconductor chip to external electrodes of the package by wire bonding. An arrangement of the external electrodes of the package is designed based on an arrangement of the pads of the semiconductor chip included in the package.

As semiconductor technology advances, various kinds of semiconductor chips have been developed. Accordingly, arrangements of pads of semiconductor chips have also been varied. Therefore, when a semiconductor chip having a new arrangement of pads is developed, a new package that is designed for the semiconductor chip is required to be developed.

SUMMARY

Some example embodiments provide a semiconductor package that is commonly used for various kinds of semiconductor chips having different arrangements of pads.

Some example embodiments provide an electronic device including the semiconductor package.

According to example embodiments, a semiconductor package includes an external electrode, an interface chip, and a semiconductor chip. The interface chip includes an external interface pad bonded to the external electrode, a plurality of internal interface pads, and an interface circuit coupled between the external interface pad and the plurality of internal interface pads. The semiconductor chip includes a signal pad that is selectively bonded to one of the plurality of internal interface pads. The interface circuit activates a connection between a selected pad, which corresponds to a pad that is bonded to the signal pad among the plurality of internal interface pads, and the external interface pad, and deactivates connections between unselected pads, which correspond to pads that are not bonded to the signal pad among the plurality of internal interface pads, and the external interface pad.

In example embodiments, the interface circuit may include a fuse circuit configured to store connection information, which represents which pad is bonded to the signal pad among the plurality of internal interface pads, a decoder configured to generate a path control signal by decoding the connection information read from the fuse circuit, and a switch configured to connect the external interface pad to the selected pad based on the path control signal.

In example embodiments, the interface circuit may include a decoder configured, in a setup mode, to receive connection information, which represents which pad is bonded to the signal pad among the plurality of internal interface pads, through the external interface pad, and to generate a path control signal by decoding the connection information, and a switch configured to connect the external interface pad to the selected pad based on the path control signal.

In example embodiments, the interface chip may further include at least one mode pad that receives connection information, which represents which pad is bonded to the signal pad among the plurality of internal interface pads, and the interface circuit may include a decoder configured to generate a path control signal by decoding the connection information received through the at least one mode pad, and a switch configured to connect the external interface pad to the selected pad based on the path control signal.

Each mode pad or pads may be coupled to one of a supply voltage and a ground voltage.

In example embodiments, the external electrode may correspond to a data input-output electrode through which data are communicated with an external device, and the signal pad may correspond to a data input-output pad that is electrically connected to the data input-output electrode through the interface chip to communicate the data with the external device.

In example embodiments, the external electrode may correspond to a clock electrode through which a clock signal is received from an external device, and the signal pad may correspond to a clock pad that is electrically connected to the clock electrode through the interface chip to receive the clock signal from the external device.

In example embodiments, the semiconductor chip may include a flash memory device.

According to example embodiments, a semiconductor package includes first through n-th external electrodes, an interface chip, and a semiconductor chip. The interface chip includes first through n-th external interface pads bonded to the first through n-th external electrodes, respectively, a plurality of first through n-th internal interface pads, and an interface circuit coupled between the first through n-th external interface pads and the plurality of first through n-th internal interface pads. The semiconductor chip includes first through n-th signal pads, and the k-th signal pad is selectively bonded to one of the plurality of k-th internal interface pads. Here, n is a positive integer, and k is a positive integer equal to or smaller than n. The interface circuit activates a connection between a selected pad, which corresponds to a pad that is bonded to the k-th signal pad among the plurality of k-th internal interface pads, and the k-th external interface pad, and deactivates connections between unselected pads, which correspond to pads that are not bonded to the k-th signal pad among the plurality of k-th internal interface pads, and the k-th external interface pad.

In example embodiments, an arrangement order of the first through n-th external interface pads may be the same as an arrangement order of the first through n-th external electrodes, to which the first through n-th external interface pads are bonded, respectively.

In example embodiments, at least one of the plurality of i-th internal interface pads may be disposed between the plurality of j-th internal interface pads. Here, i and j are positive integers equal to or smaller than n, and i and j are different from each other.

In example embodiments, the interface circuit may include a fuse circuit configured to store connection information, which represents which pads are bonded to the first through n-th signal pads, respectively, among the plurality of first through n-th internal interface pads, a decoder configured to generate first through n-th path control signals by decoding the connection information read from the fuse circuit, and first through n-th switches, the k-th switch connecting the k-th external interface pad to the selected pad, which corresponds to the pad that is bonded to the k-th signal pad among the plurality of k-th internal interface pads, based on the k-th path control signal.

In example embodiments, the interface circuit may include a decoder configured, in a setup mode, to receive connection information, which represents which pads are bonded to the first through n-th signal pads, respectively, among the plurality of first through n-th internal interface pads, through at least one of the first through n-th external interface pads, and to generate first through n-th path control signals by decoding the connection information, and first through n-th switches. The k-th switch may connect the k-th external interface pad to the selected pad, which corresponds to the pad that is bonded to the k-th signal pad among the plurality of k-th internal interface pads, based on the k-th path control signal.

In example embodiments, the interface chip may further include at least one mode pad that receives connection information, which represents which pads are bonded to the first through n-th signal pads, respectively, among the plurality of first through n-th internal interface pads, and the interface circuit may include a decoder configured to generate a path control signal by decoding the connection information received through the at least one mode pad, and first through n-th switches. The k-th switch may connect the k-th external interface pad to the selected pad, which corresponds to the pad that is bonded to the k-th signal pad among the plurality of k-th internal interface pads, based on the path control signal.

Each of the at least one mode pad may be coupled to one of a supply voltage and a ground voltage.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
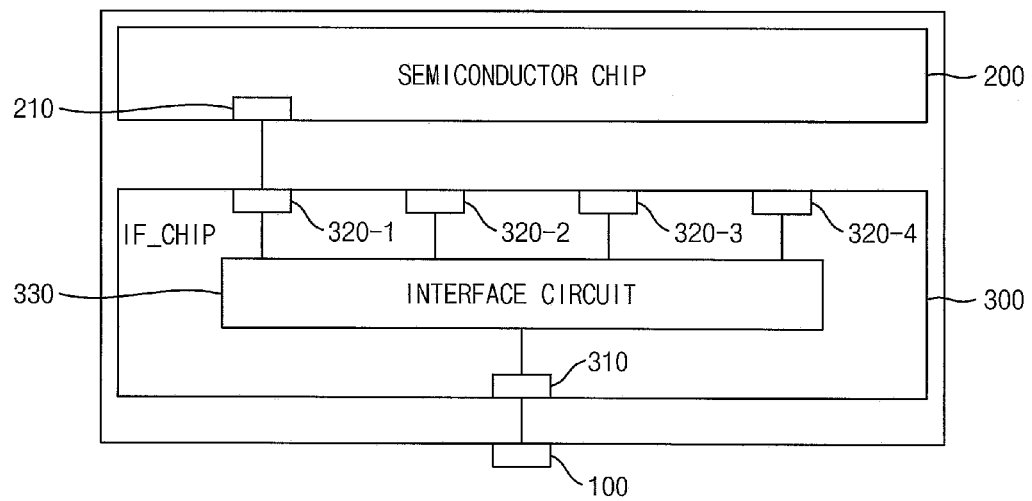
FIG. 1 is a diagram illustrating a semiconductor package according to example embodiments.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 is a diagram illustrating a semiconductor package according to example embodiments.

Referring to FIG. 1, a semiconductor package 10 includes an external electrode 100, a semiconductor chip 200, and an interface chip IF_CHIP 300. The semiconductor package 10 is connected to an external device through the external electrode 100. Although the semiconductor package 10 includes a plurality of external electrodes, one external electrode 100 among the plurality of external electrodes is illustrated in FIG. 1 for ease of explanation.

The semiconductor chip 200 may include a signal pad 210 that is electrically connected to the external electrode 100 through the interface chip 300. Therefore, the semiconductor chip 200 may communicate a signal with the external device through the signal pad 210. Although the semiconductor chip 200 includes a plurality of signal pads, one signal pad 210, which is electrically connected to the external electrode 100, among the plurality of signal pads is illustrated in FIG. 1 for ease of explanation.

The interface chip 300 may include an external interface pad 310, a plurality of internal interface pads 320-1, 320-2, 320-3, and 320-4, and an interface circuit 330. The external interface pad 310 may be wire bonded to the external electrode 100.

In some example embodiments, the external interface pad 310 included in the interface chip 300 may be located near the external electrode 100 to minimize a length of a wire connecting the external interface pad 310 to the external electrode 100.

The signal pad 210 included in the semiconductor chip 200 may be selectively wire bonded to one of the plurality of internal interface pads 320-1, 320-2, 320-3, and 320-4 included in the interface chip 300.

In some example embodiments, the signal pad 210 may be wire bonded to the closest internal interface pad from the signal pad 210 among the plurality of internal interface pads 320-1, 320-2, 320-3, and 320-4.

In other example embodiments, the signal pad 210 may be wire bonded to the most easy internal interface pad to perform a wire bonding process with the signal pad 210 among the plurality of internal interface pads 320-1, 320-2, 320-3, and 320-4.

FIG. 1 illustrates that the signal pad 210 is wire bonded to the first internal interface pad 320-1 as an example.

Although the interface chip 300 is illustrated to include four internal interface pads 320-1, 320-2, 320-3, and 320-4 in FIG. 1, example embodiments are not limited thereto. According to example embodiments, the interface chip 300 may include any number of internal interface pads.

The interface circuit 330 may be coupled between the external interface pad 310 and the plurality of internal interface pads 320-1, 320-2, 320-3, and 320-4.

The interface circuit 330 may activate a connection between a selected pad 320-1, which corresponds to a pad that is bonded to the signal pad 210 among the plurality of internal interface pads 320-1, 320-2, 320-3, and 320-4, and the external interface pad 310, and deactivate connections between unselected pads 320-2, 320-3, and 320-4, which correspond to pads that are not bonded to the signal pad 210 among the plurality of internal interface pads 320-1, 320-2, 320-3, and 320-4, and the external interface pad 310.

Therefore, the signal pad 210 included in the semiconductor chip 200 may be electrically connected to the external electrode 100 through the interface chip 300.

In some example embodiments, the semiconductor chip 200 may include a memory device. For example, the semiconductor chip 200 may include a flash memory device. In this case, the semiconductor package 10 may correspond to a nonvolatile memory module.

In some example embodiments, the external electrode 100 may correspond to a data input-output electrode through which data are communicated with the external device. In this case, the signal pad 210 included in the semiconductor chip 200 may correspond to a data input-output pad that is electrically connected to the data input-output electrode through the interface chip 300 to communicate the data with the external device.

In some example embodiments, the external electrode 100 may correspond to a clock electrode through which a clock signal is received from the external device. In this case, the signal pad 210 included in the semiconductor chip 200 may correspond to a clock pad that is electrically connected to the clock electrode through the interface chip 300 to receive the clock signal from the external device.

Although the semiconductor package 10 is illustrated to include one semiconductor chip 200 in FIG. 1, example embodiments are not limited thereto. According to example embodiments, the semiconductor package 10 may include a plurality of semiconductor chips. In this case, the signal pad 210 included in each of the plurality of semiconductor chips may be electrically connected to a corresponding external electrode 100 through the interface chip 300.

Figure 2:
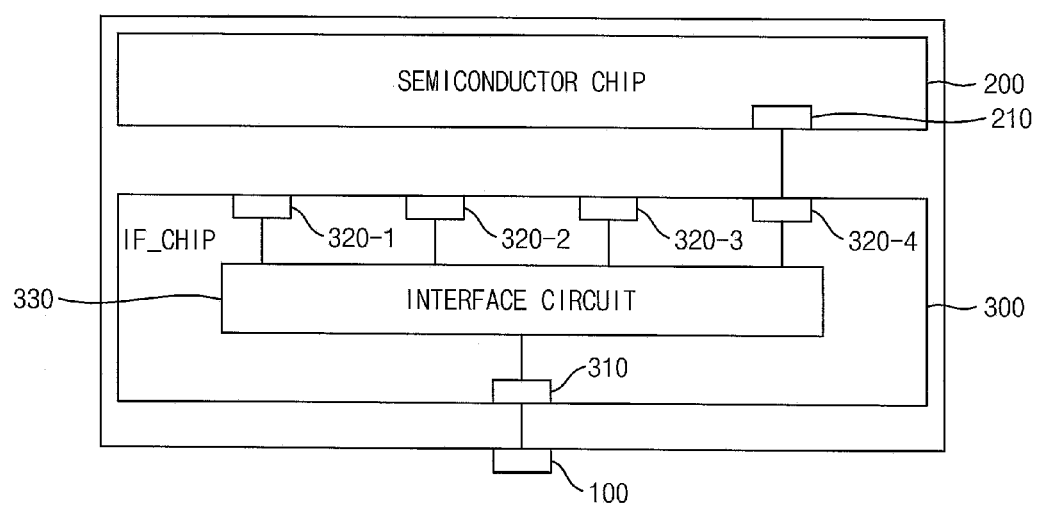
FIG. 2 is a diagram illustrating a semiconductor package according to example embodiments.

FIG. 2 is a diagram illustrating a semiconductor package according to example embodiments.

The semiconductor package 10 of FIG. 2 is the same as the semiconductor package 10 of FIG. 1 except that the signal pad 210 included in the semiconductor chip 200 of the semiconductor package 10 of FIG. 1 is located on a first side (e.g., left side) of the semiconductor chip 200 while the signal pad 210 included in the semiconductor chip 200 of the semiconductor package 10 of FIG. 2 is located on a second side (e.g., right side) of the semiconductor chip 200.

As illustrated in FIG. 1, since the signal pad 210 included in the semiconductor chip 200 of the semiconductor package 10 of FIG. 1 is located on the first side of the semiconductor chip 200, the signal pad 210 may be bonded to the first internal interface pad 320-1, which is located on the first side among the plurality of internal interface pads 320-1, 320-2, 320-3, and 320-4. In this case, the interface circuit 330 may activate a connection between a selected pad 320-1, which corresponds to a pad that is bonded to the signal pad 210 among the plurality of internal interface pads 320-1, 320-2, 320-3, and 320-4, and the external interface pad 310, and deactivate connections between unselected pads 320-2, 320-3, and 320-4, which correspond to pads that are not bonded to the signal pad 210 among the plurality of internal interface pads 320-1, 320-2, 320-3, and 320-4, and the external interface pad 310, such that the signal pad 210 included in the semiconductor chip 200 may be electrically connected to the external electrode 100 through the interface chip 300.

On the other hand, as illustrated in FIG. 2, since the signal pad 210 included in the semiconductor chip 200 of the semiconductor package 10 of FIG. 2 is located on the second side of the semiconductor chip 200, the signal pad 210 may be bonded to the fourth internal interface pad 320-4, which is located on the second side among the plurality of internal interface pads 320-1, 320-2, 320-3, and 320-4. In this case, the interface circuit 330 may activate a connection between a selected pad 320-4, which corresponds to a pad that is bonded to the signal pad 210 among the plurality of internal interface pads 320-1, 320-2, 320-3, and 320-4, and the external interface pad 310, and deactivate connections between unselected pads 320-1, 320-2, and 320-3, which correspond to pads that are not bonded to the signal pad 210 among the plurality of internal interface pads 320-1, 320-2, 320-3, and 320-4, and the external interface pad 310, such that the signal pad 210 included in the semiconductor chip 200 may be electrically connected to the external electrode 100 through the interface chip 300.

As described above with reference to FIGS. 1 and 2, in the semiconductor package 10 according to example embodiments, the signal pad 210 may be easily connected to the external electrode 100 through the interface chip 300 regardless of a location of the signal pad 210 on the semiconductor chip 200.

Figure 3:
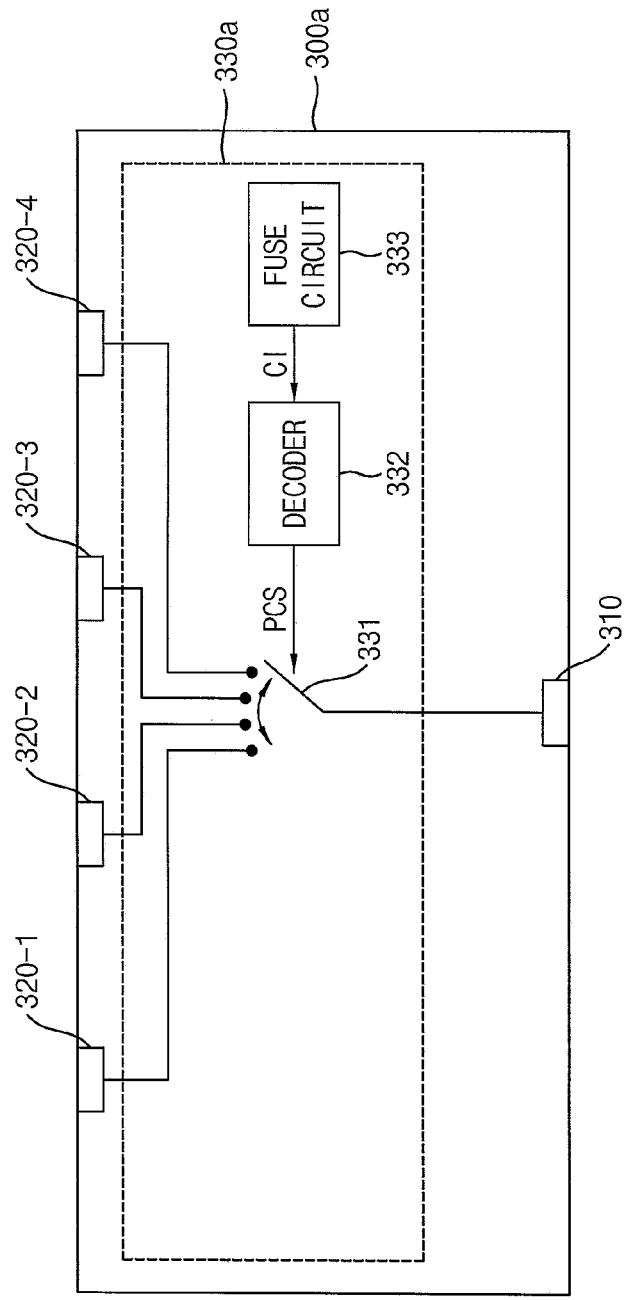
FIG. 3 is a diagram illustrating an example of an interface chip included in the semiconductor package of FIG. 1.

FIG. 3 is a diagram illustrating an example of an interface chip included in the semiconductor package of FIG. 1.

Referring to FIG. 3, an interface chip 300a may include an external interface pad 310, a plurality of internal interface pads 320-1, 320-2, 320-3, and 320-4, and an interface circuit 330a. The interface circuit 330a may include a switch 331, a decoder 332, and a fuse circuit 333. The fuse circuit 333 may store connection information CI, which represents which pad is bonded to the signal pad 210 of the semiconductor chip 200 among the plurality of internal interface pads 320-1, 320-2, 320-3, and 320-4.

For example, as illustrated in FIG. 1, when the signal pad 210 is bonded to the first internal interface pad 320-1 among the plurality of internal interface pads 320-1, 320-2, 320-3, and 320-4, the fuse circuit 333 may store the connection information CI corresponding to "01". On the other hand, as illustrated in FIG. 2, when the signal pad 210 is bonded to the fourth internal interface pad 320-4 among the plurality of internal interface pads 320-1, 320-2, 320-3, and 320-4, the fuse circuit 333 may store the connection information CI corresponding to "04".

In some example embodiments, the connection information CI may be stored in the fuse circuit 333 by performing a fuse cutting process on the fuse circuit 333 while manufacturing the semiconductor package 10.

The decoder 332 may read the connection information CI from the fuse circuit 333, and generate a path control signal PCS by decoding the connection information CI.

The switch 331 may include a first electrode, which is coupled to the external interface pad 310, and a second electrode, which is coupled to one of the plurality of internal interface pads 320-1, 320-2, 320-3, and 320-4 based on the path control signal PCS.

The path control signal PCS may represent the selected pad, which corresponds to a pad that is bonded to the signal pad 210 of the semiconductor chip 200 among the plurality of internal interface pads 320-1, 320-2, 320-3, and 320-4. Therefore, the switch 331 may selectively connect the external interface pad 310 to the selected pad, which corresponds to the pad that is bonded to the signal pad 210 of the semiconductor chip 200 among the plurality of internal interface pads 320-1, 320-2, 320-3, and 320-4, based on the path control signal PCS.

Therefore, the signal pad 210 included in the semiconductor chip 200 may be easily connected to the external electrode 100 through the interface chip 300 regardless of a location of the signal pad 210 on the semiconductor chip 200.

Figure 4:
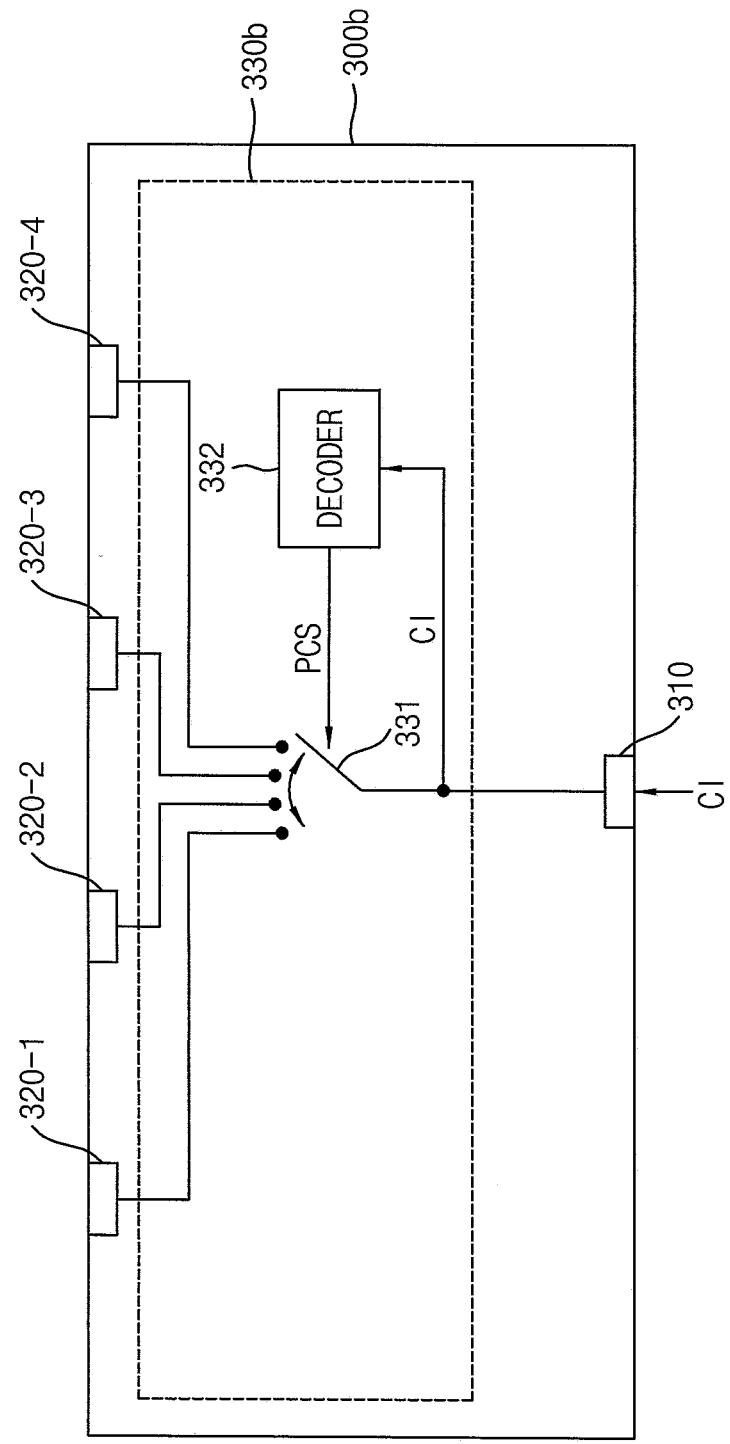
FIG. 4 is a diagram illustrating an example of an interface chip included in the semiconductor package of FIG. 1.

FIG. 4 is a diagram illustrating an example of an interface chip included in the semiconductor package of FIG. 1.

Referring to FIG. 4, an interface chip 300b may include an external interface pad 310, a plurality of internal interface pads 320-1, 320-2, 320-3, and 320-4, and an interface circuit 330b. The interface circuit 330b may include a switch 331 and a decoder 332.

In a setup mode, the semiconductor package 10 may receive connection information CI, which represents which pad is bonded to the signal pad 210 of the semiconductor chip 200 among the plurality of internal interface pads 320-1, 320-2, 320-3, and 320-4, from an external device through the external electrode 100. For example, at an initial stage of power-up, the semiconductor package 10 may receive the connection information CI from the external device through the external electrode 100. The connection information CI received from the external device may be provided to the decoder 332 through the external electrode 100 and the external interface pad 310.

In the setup mode, the decoder 332 may receive the connection information CI through the external interface pad 310, and generate a path control signal PCS by decoding the connection information CI. The switch 331 may include a first electrode, which is coupled to the external interface pad 310, and a second electrode, which is coupled to one of the plurality of internal interface pads 320-1, 320-2, 320-3, and 320-4 based on the path control signal PCS.

The path control signal PCS may represent the selected pad, which corresponds to a pad that is bonded to the signal pad 210 of the semiconductor chip 200 among the plurality of internal interface pads 320-1, 320-2, 320-3, and 320-4. Therefore, the switch 331 may selectively connect the external interface pad 310 to the selected pad, which corresponds to the pad that is bonded to the signal pad 210 of the semiconductor chip 200 among the plurality of internal interface pads 320-1, 320-2, 320-3, and 320-4, based on the path control signal PCS.

Therefore, the signal pad 210 included in the semiconductor chip 200 may be easily connected to the external electrode 100 through the interface chip 300 regardless of a location of the signal pad 210 on the semiconductor chip 200.

Figure 5:
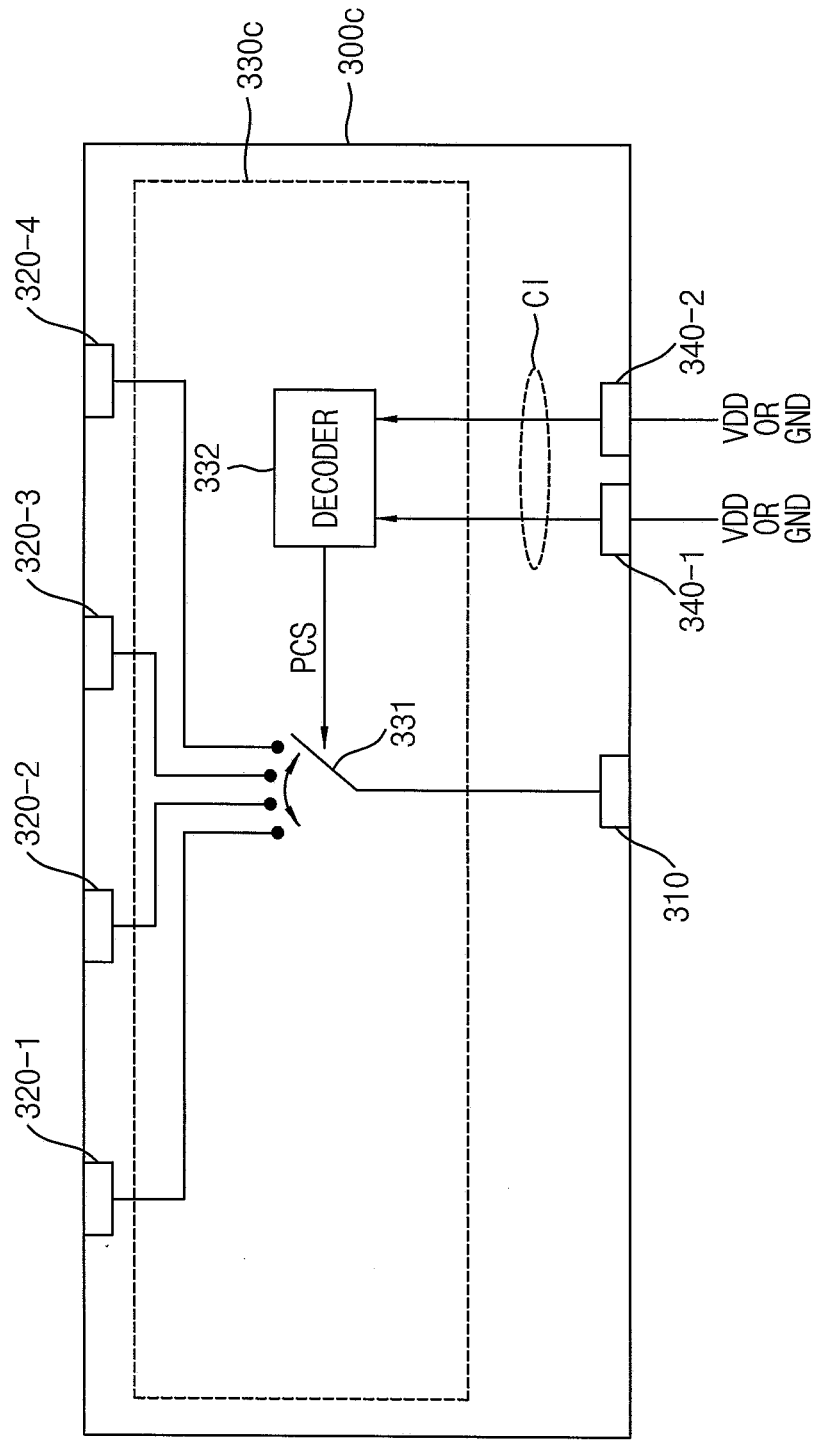
FIG. 5 is a diagram illustrating an example of an interface chip included in the semiconductor package of FIG. 1.

FIG. 5 is a diagram illustrating an example of an interface chip included in the semiconductor package of FIG. 1.

Referring to FIG. 5, an interface chip 300c may include an external interface pad 310, a plurality of internal interface pads 320-1, 320-2, 320-3, and 320-4, an interface circuit 330c, and at least one mode pad 340-1 and 340-2. Although the interface chip 300c is illustrated to include two mode pads 340-1 and 340-2 in FIG. 5, example embodiments are not limited thereto. According to example embodiments, the interface chip 300c may include any number of mode pads.

The interface chip 300c may receive connection information CI, which represents which pad is bonded to the signal pad 210 of the semiconductor chip 200 among the plurality of internal interface pads 320-1, 320-2, 320-3, and 320-4, through the at least one mode pad 340-1 and 340-2. For example, the connection information CI may correspond to a combination of signals received through the at least one mode pad 340-1 and 340-2.

In some example embodiments, each of the at least one mode pad 340-1 and 340-2 may be coupled to one of a supply voltage VDD and a ground voltage GND. For example, when the interface chip 300c includes two mode pads 340-1 and 340-2, and each of the two mode pads 340-1 and 340-2 is coupled to one of the supply voltage VDD and the ground voltage GND, the connection information CI may correspond to one of "00", "01", "10", and "11". Therefore, the connection information CI may represent one of four internal interface pads 320-1, 320-2, 320-3, and 320-4.

The interface circuit 330c may include a switch 331 and a decoder 332. The decoder 332 may receive the connection information CI through the at least one mode pad 340-1 and 340-2, and generate a path control signal PCS by decoding the connection information CI. The switch 331 may include a first electrode, which is coupled to the external interface pad 310, and a second electrode, which is coupled to one of the plurality of internal interface pads 320-1, 320-2, 320-3, and 320-4 based on the path control signal PCS.

The path control signal PCS may represent the selected pad, which corresponds to a pad that is bonded to the signal pad 210 of the semiconductor chip 200 among the plurality of internal interface pads 320-1, 320-2, 320-3, and 320-4. Therefore, the switch 331 may selectively connect the external interface pad 310 to the selected pad, which corresponds to the pad that is bonded to the signal pad 210 of the semiconductor chip 200 among the plurality of internal interface pads 320-1, 320-2, 320-3, and 320-4, based on the path control signal PCS.

Therefore, the signal pad 210 included in the semiconductor chip 200 may be easily connected to the external electrode 100 through the interface chip 300 regardless of a location of the signal pad 210 on the semiconductor chip 200.

In a conventional semiconductor package, pads of a semiconductor chip are directly coupled to external electrodes of a package by wire bonding. Therefore, when a new semiconductor chip, which has an arrangement of pads different from an arrangement of pads of an existing semiconductor chip, is developed, a new package, which has an arrangement of external electrodes that conforms with the arrangement of pads of the new semiconductor chip, is required to be developed.

However, as described above with reference to FIGS. 1 to 5, since the semiconductor package 10 according to example embodiments includes the interface chip 300 that electrically connects the signal pad 210 of the semiconductor chip 200 to the external electrode 100, the signal pad 210 may be easily connected to the external electrode 100 through the interface chip 300 even when the signal pad 210 is located far from the external electrode 100 or it is difficult to directly connect the signal pad 210 to the external electrode 100 by wire bonding. Therefore, even when various kinds of semiconductor chips have different arrangements of pads from each other, the semiconductor chips may be implemented as a package having the same form by the semiconductor package 10 according to example embodiments.

Figure 6:
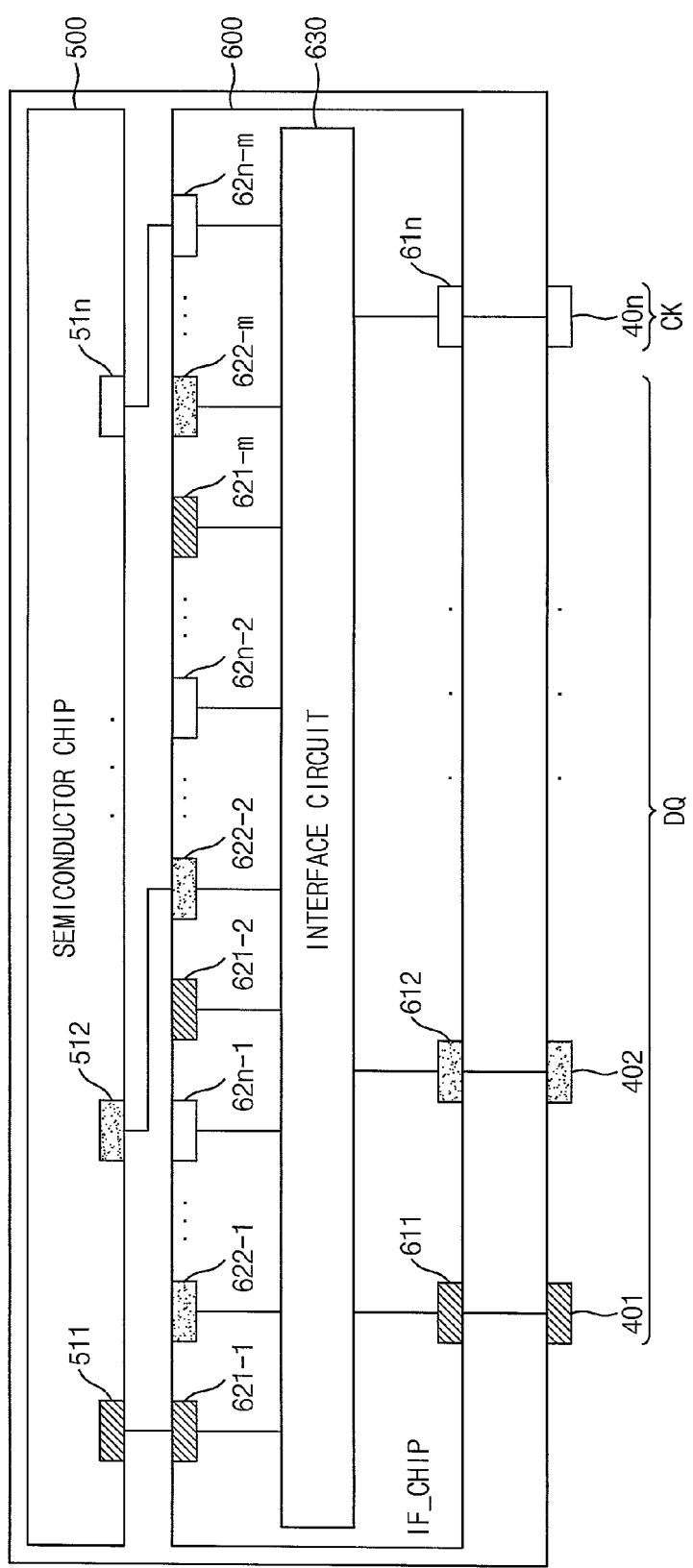
FIG. 6 is a diagram illustrating a semiconductor package according to example embodiments.

FIG. 6 is a diagram illustrating a semiconductor package according to example embodiments.

Referring to FIG. 6, a semiconductor package 20 includes first through n-th external electrodes 401, 402, . . . , 40n, a semiconductor chip 500, and an interface chip IF_CHIP 600. Here, n represents a positive integer.

The semiconductor package 20 is connected to an external device through the first through n-th external electrodes 401, 402, . . . , 40n.

The semiconductor chip 500 may include first through n-th signal pads 511, 512, . . . , 51n that are electrically connected to the first through n-th external electrodes 401, 402, . . . , 40n, respectively, through the interface chip 600. Therefore, the semiconductor chip 500 may communicate a signal with the external device through the first through n-th signal pads 511, 512, . . . , 51n.

The interface chip 600 may include first through n-th external interface pads 611, 612, . . . , 61n, a plurality of first through n-th internal interface pads 621-1, 621-2, . . . , 621-m, 622-1, 622-2, . . . , 622-m, . . . , 62n-1, 62n-2, . . . , 62n-m, and an interface circuit 630. Here, m represents a positive integer.

The plurality of first through n-th internal interface pads 621-1, 621-2, . . . , 621-m, 622-1, 622-2, . . . , 622-m, . . . , 62n-1, 62n-2, . . . , 62n-m may correspond to the first through n-th external interface pads 611, 612, . . . , 61n, respectively. That is, the plurality of first internal interface pads 621-1, 621-2, . . . , 621-m may correspond to the first external interface pad 611, the plurality of second internal interface pads 622-1, 622-2, . . . , 622-m may correspond to the second external interface pad 612, and the plurality of n-th internal interface pads 62n-1, 62n-2, . . . , 62n-m may correspond to the n-th external interface pad 61n.

In some example embodiments, on the interface chip 600, at least one of the plurality of i-th internal interface pads 62i-1, 62i-2, . . . , 62i-m may be disposed between the plurality of j-th internal interface pads 62j-1, 62j-2, . . . , 62j-m. For example, as illustrated in FIG. 6, the plurality of i-th internal interface pads 62i-1, 62i-2, . . . , 62i-m and the plurality of j-th internal interface pads 62j-1, 62j-2, . . . , 62j-m may be alternately arranged on the interface chip 600. Here, i and j represent positive integers equal to or smaller than n, and i and j are different from each other.

Therefore, the plurality of first internal interface pads 621-1, 621-2, . . . , 621-m, the plurality of second internal interface pads 622-1, 622-2, . . . , 622-m, and the plurality of n-th internal interface pads 62n-1, 62n-2, . . . , 62n-m may be dispersed on the interface chip 600.

Although the number of the plurality of first internal interface pads 621-1, 621-2, . . . , 621-m, the number of the plurality of second internal interface pads 622-1, 622-2, . . . , 622-m, and the number of the plurality of n-th internal interface pads 62n-1, 62n-2, . . . , 62n-m are the same in FIG. 1, example embodiments are not limited thereto. According to example embodiments, the number of the plurality of first internal interface pads 621-1, 621-2, . . . , 621-m, the number of the plurality of second internal interface pads 622-1, 622-2, . . . , 622-m, and the number of the plurality of n-th internal interface pads 62n-1, 62n-2, . . . , 62n-m may be different from each other.

The first through n-th external interface pads 611, 612, . . . , 61n may be wire bonded to the first through n-th external electrodes 401, 402, . . . , 40n, respectively.

In some example embodiments, each of the first through n-th external interface pads 611, 612, . . . , 61n included in the interface chip 600 may be located near the first through n-th external electrodes 401, 402, . . . , 40n, respectively. For example, an arrangement order of the first through n-th external interface pads 611, 612, . . . , 61n may be the same as an arrangement order of the first through n-th external electrodes 401, 402, . . . , 40n, to which the first through n-th external interface pads 611, 612, . . . , 61n are bonded, respectively. Therefore, a length of a wire connecting the first through n-th external interface pads 611, 612, . . . , 61n to the first through n-th external electrodes 401, 402, . . . , 40n, respectively, may be controlled or minimized.

The k-th signal pad 51k included in the semiconductor chip 500 may be selectively wire bonded to one of the plurality of k-th internal interface pads 62k-1, 62k-2, . . . , 62k-m included in the interface chip 600. Here, k represents a positive integer equal to or smaller than n. For example embodiments, the first signal pad 511 may be selectively wire bonded to one of the plurality of first internal interface pads 621-1, 621-2, . . . , 621-m included in the interface chip 600, the second signal pad 512 may be selectively wire bonded to one of the plurality of second internal interface pads 622-1, 622-2, . . . , 622-m included in the interface chip 600, and the n-th signal pad 51n may be selectively wire bonded to one of the plurality of n-th internal interface pads 62n-1, 62n-2, . . . , 62n-m included in the interface chip 600.

In some example embodiments, the k-th signal pad 51k may be wire bonded to the closest k-th internal interface pad from the k-th signal pad 51k among the plurality of k-th internal interface pads 62k-1, 62k-2, . . . , 62k-m.

In other example embodiments, the k-th signal pad 51k may be wire bonded to the most easy k-th internal interface pad to perform a wire bonding process with the k-th signal pad 51k among the plurality of k-th internal interface pads 62k-1, 62k-2, . . . , 62k-m.

FIG. 6 illustrates that the first signal pad 511 is wire bonded to the internal interface pad 621-1 among the plurality of first internal interface pads 621-1, 621-2, . . . , 621-m, the second signal pad 512 is wire bonded to the internal interface pad 622-2 among the plurality of second internal interface pads 622-1, 622-2, . . . , 622-m, and the n-th signal pad 51n is wire bonded to the internal interface pad 62n-m among the plurality of n-th internal interface pads 62n-1, 62n-2, . . . , 62n-m, as an example.

The interface circuit 630 may be coupled between the first through n-th external interface pads 611, 612, . . . , 61n and the plurality of first through n-th internal interface pads 621-1, 621-2, . . . , 621-m, 622-1, 622-2, . . . , 622-m, . . . , 62n-1, 62n-2, . . . , 62n-m.

The interface circuit 630 may activate a connection between a selected pad, which corresponds to a pad that is bonded to the k-th signal pad 51k among the plurality of k-th internal interface pads 62k-1, 62k-2, . . . , 62k-m, and the k-th external interface pad 61k, and deactivate connections between unselected pads, which correspond to pads that are not bonded to the k-th signal pad 51k among the plurality of k-th internal interface pads 62k-1, 62k-2, . . . , 62k-m, and the k-th external interface pad 61k.

Therefore, the first through n-th signal pads 511, 512, . . . , 51n included in the semiconductor chip 500 may be electrically connected to the first through n-th external electrodes 401, 402, . . . , 40n, respectively, through the interface chip 600.

In some example embodiments, the semiconductor chip 500 may include a memory device. For example, the semiconductor chip 500 may include a flash memory device. In this case, the semiconductor package 20 may correspond to a nonvolatile memory module.

In some example embodiments, the first through n-th external electrodes 401, 402, . . . , 40n may include a plurality of data input-output electrodes through which data are communicated with the external device. In this case, the first through n-th signal pads 511, 512, . . . , 51n included in the semiconductor chip 500 may include a plurality of data input-output pads that are electrically connected to the plurality of data input-output electrodes, respectively, through the interface chip 600 to communicate the data with the external device. For example, as illustrated in FIG. 6, the first through (n−1)-th external electrodes 401, 402, . . . , 40(n−1) may correspond to the plurality of data input-output electrodes DQ, and the first through (n−1)-th signal pads 511, 512, . . . , 51(n−1) may correspond to the plurality of data input-output pads.

In some example embodiments, the first through n-th external electrodes 401, 402, . . . , 40n may include at least one clock electrode through which a clock signal is received from the external device. In this case, the first through n-th signal pads 511, 512, . . . , 51n included in the semiconductor chip 500 may include at least one clock pad that is electrically connected to the at least one clock electrode through the interface chip 600 to receive the clock signal from the external device. For example, as illustrated in FIG. 6, the n-th external electrode 40n may correspond to the at least one clock electrode CK, and the n-th signal pad 51n may correspond to the at least one clock pad.

According to example embodiments, the semiconductor package 20 may further include various kinds of external electrodes, such as a data strobe electrode through which a data strobe signal is received.

Although the semiconductor package 20 is illustrated to include one semiconductor chip 500 in FIG. 6, example embodiments are not limited thereto. According to example embodiments, the semiconductor package 20 may include a plurality of semiconductor chips. In this case, each of the signal pads included in the plurality of semiconductor chips may be electrically connected to a corresponding external electrode through the interface chip 600.

As described above with reference with FIG. 6, in the semiconductor package 20 according to example embodiments, the first through n-th signal pads 511, 512, . . . , 51n included in the semiconductor chip 500 may be easily connected to the first through n-th external electrodes 401, 402, . . . , 40n, respectively, through the interface chip 600 regardless of an arrangement of the first through n-th signal pads 511, 512, . . . , 51n on the semiconductor chip 500.

Figure 7:
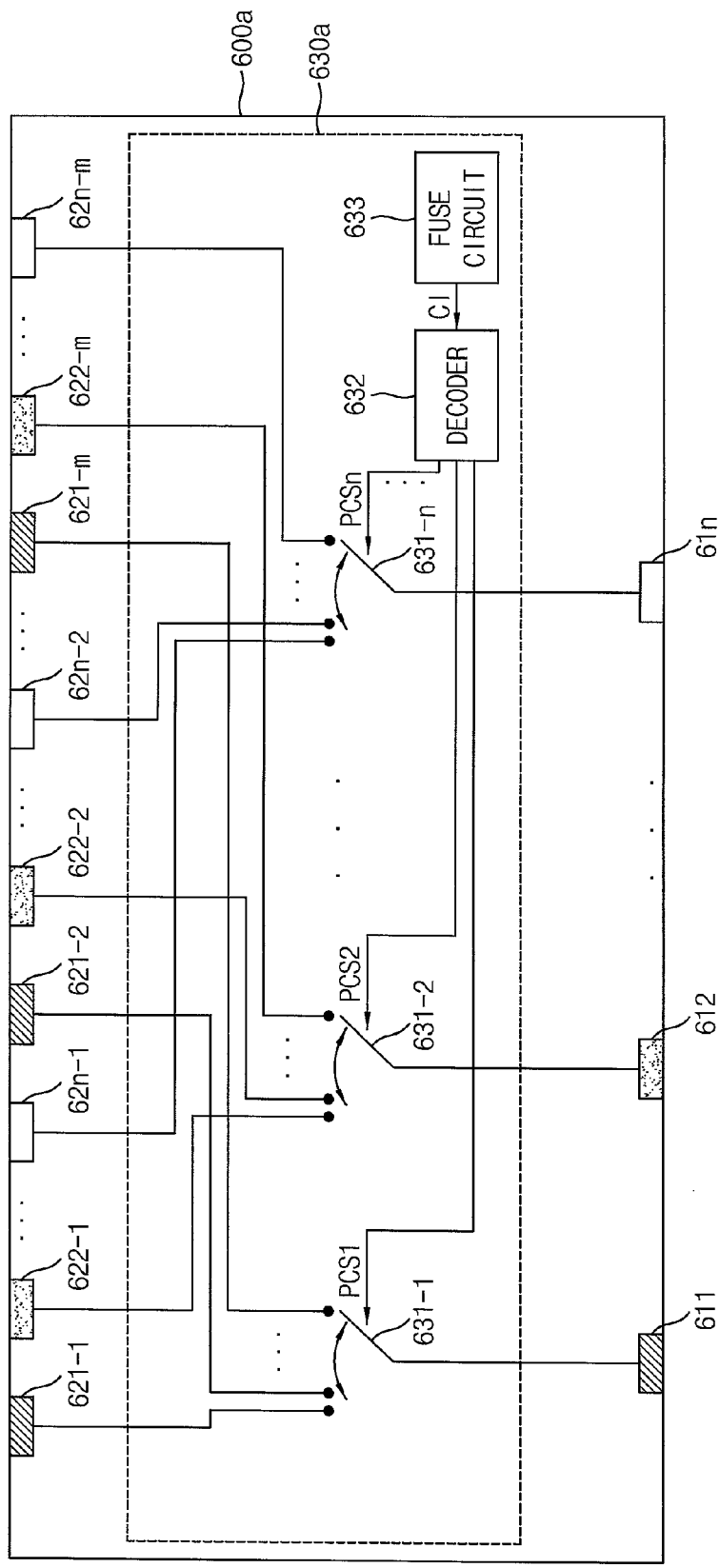
FIG. 7 is a diagram illustrating an example of an interface chip included in the semiconductor package of FIG. 6.

FIG. 7 is a diagram illustrating an example of an interface chip included in the semiconductor package of FIG. 6.

Referring to FIG. 7, an interface chip 600a may include first through n-th external interface pads 611, 612, . . . , 61n, a plurality of first through n-th internal interface pads 621-1, 621-2, . . . , 621-m, 622-1, 622-2, . . . , 622-m, . . . , 62n-1, 62n-2, . . . , 62n-m, and an interface circuit 630a. The interface circuit 630a may include first through n-th switches 631-1, 631-2, . . . , 631-n, a decoder 632, and a fuse circuit 633.

The fuse circuit 633 may store connection information CI, which represents which pads are bonded to the first through n-th signal pads 511, 512, . . . , 51n of the semiconductor chip 500 among the plurality of first through n-th internal interface pads 621-1, 621-2, . . . , 621-m, 622-1, 622-2, . . . , 622-m, . . . , 62n-1, 62n-2, . . . , 62n-m.

For example, the connection information CI may include information about which pad is bonded to the first signal pad 511 among the plurality of first internal interface pads 621-1, 621-2, . . . , 621-m, information about which pad is bonded to the second signal pad 512 among the plurality of second internal interface pads 622-1, 622-2, . . . , 622-m, and information about which pad is bonded to the n-th signal pad 51n among the plurality of n-th internal interface pads 62n-1, 62n-2, . . . , 62n-m.

In some example embodiments, the connection information CI may be stored in the fuse circuit 633 by performing a fuse cutting process on the fuse circuit 633 while manufacturing the semiconductor package 20.

The decoder 632 may read the connection information CI from the fuse circuit 633, and generate first through n-th path control signals PCS1, PCS2, . . . , PCSn by decoding the connection information CI.

The k-th path control signal PCSk may represent the selected pad, which corresponds to a pad that is bonded to the k-th signal pad 51k of the semiconductor chip 500 among the plurality of k-th internal interface pads 62k-1, 62k-2, . . . , 62k-m. Therefore, the k-th switch 631-k may selectively connect the k-th external interface pad 61k to the selected pad, which corresponds to the pad that is bonded to the k-th signal pad 51k of the semiconductor chip 500 among the plurality of k-th internal interface pads 62k-1, 62k-2, . . . , 62k-m, based on the k-th path control signal PCSk.

Therefore, the first through n-th signal pads 511, 512, . . . , 51n included in the semiconductor chip 500 may be easily connected to the first through n-th external electrodes 401, 402, . . . , 40n, respectively, through the interface chip 600 regardless of an arrangement of the first through n-th signal pads 511, 512, . . . , 51n on the semiconductor chip 500.

Figure 8:
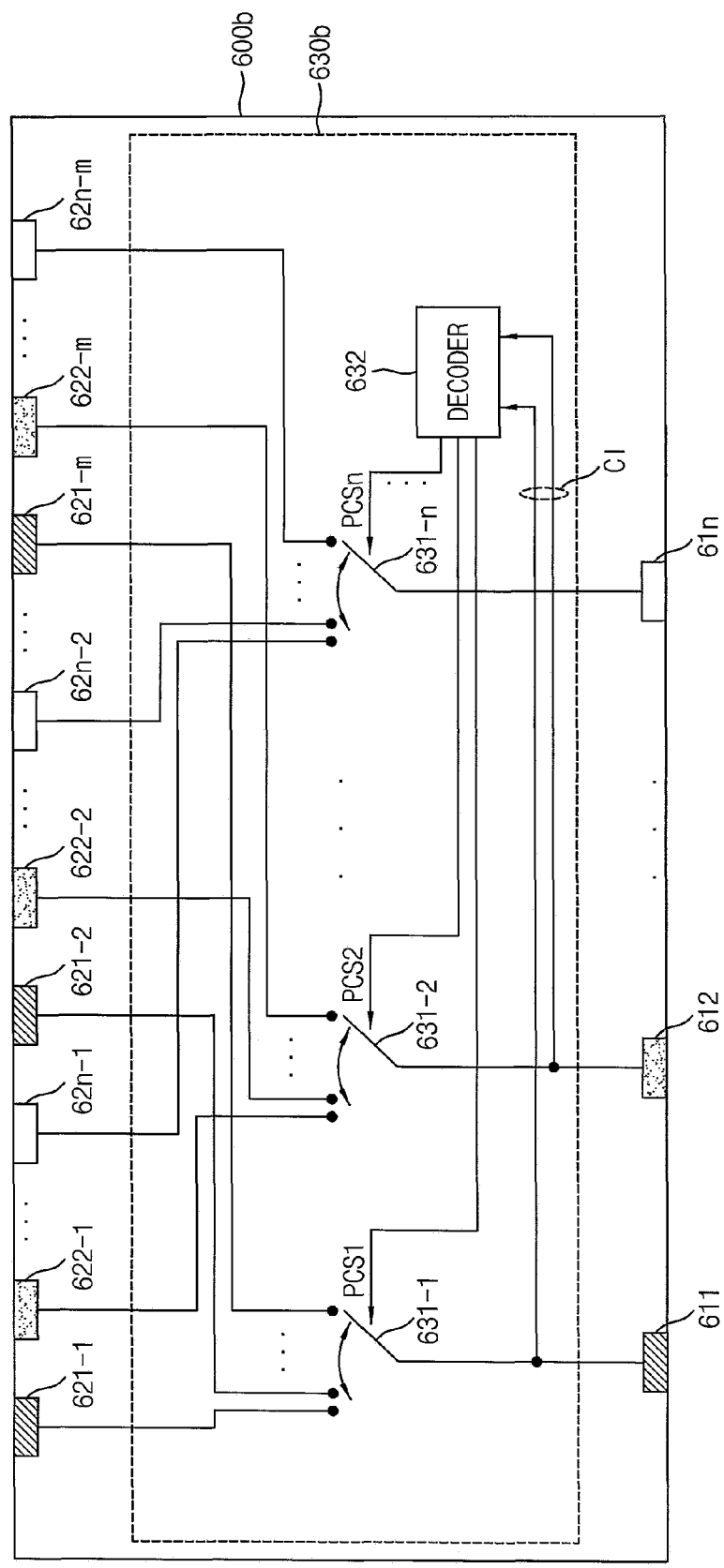
FIG. 8 is a diagram illustrating an example of an interface chip included in the semiconductor package of FIG. 6.

FIG. 8 is a diagram illustrating an example of an interface chip included in the semiconductor package of FIG. 6.

Referring to FIG. 8, an interface chip 600b may include first through n-th external interface pads 611, 612, . . . , 61n, a plurality of first through n-th internal interface pads 621-1, 621-2, . . . , 621-m, 622-1, 622-2, . . . , 622-m, . . . , 62n-1, 62n-2, . . . , 62n-m, and an interface circuit 630b. The interface circuit 630b may include first through n-th switches 631-1, 631-2, . . . , 631-n and a decoder 632.

In a setup mode, the semiconductor package 20 may receive connection information CI, which represents which pads are bonded to the first through n-th signal pads 511, 512, . . . , 51n of the semiconductor chip 500 among the plurality of first through n-th internal interface pads 621-1, 621-2, . . . , 621-m, 622-1, 622-2, . . . , 622-m, . . . , 62n-1, 62n-2, . . . , 62n-m, from an external device through at least one of the first through n-th external electrodes 401, 402, . . . , 40n. For example, at an initial stage of power-up, the semiconductor package 20 may receive the connection information CI from the external device through at least one of the first through n-th external electrodes 401, 402, . . . , 40n. The connection information CI received from the external device may be provided to the decoder 632 through at least one of the first through n-th external interface pads 611, 612, . . . , 61n corresponding to the at least one of the first through n-th external electrodes 401, 402, . . . , 40n receiving the connection information CI.

In the setup mode, the decoder 632 may receive the connection information CI through the at least one of the first through n-th external interface pads 611, 612, . . . , 61n, and generate first through n-th path control signals PCS1, PCS2, . . . , PCSn by decoding the connection information CI.

The k-th path control signal PCSk may represent the selected pad, which corresponds to a pad that is bonded to the k-th signal pad 51k of the semiconductor chip 500 among the plurality of k-th internal interface pads 62k-1, 62k-2, . . . , 62k-m. Therefore, the k-th switch 631-k may selectively connect the k-th external interface pad 61k to the selected pad, which corresponds to the pad that is bonded to the k-th signal pad 51k of the semiconductor chip 500 among the plurality of k-th internal interface pads 62k-1, 62k-2, . . . , 62k-m, based on the k-th path control signal PCSk.

Therefore, the first through n-th signal pads 511, 512, . . . , 51n included in the semiconductor chip 500 may be easily connected to the first through n-th external electrodes 401, 402, . . . , 40n, respectively, through the interface chip 600 regardless of an arrangement of the first through n-th signal pads 511, 512, . . . , 51n on the semiconductor chip 500.

Figure 9:
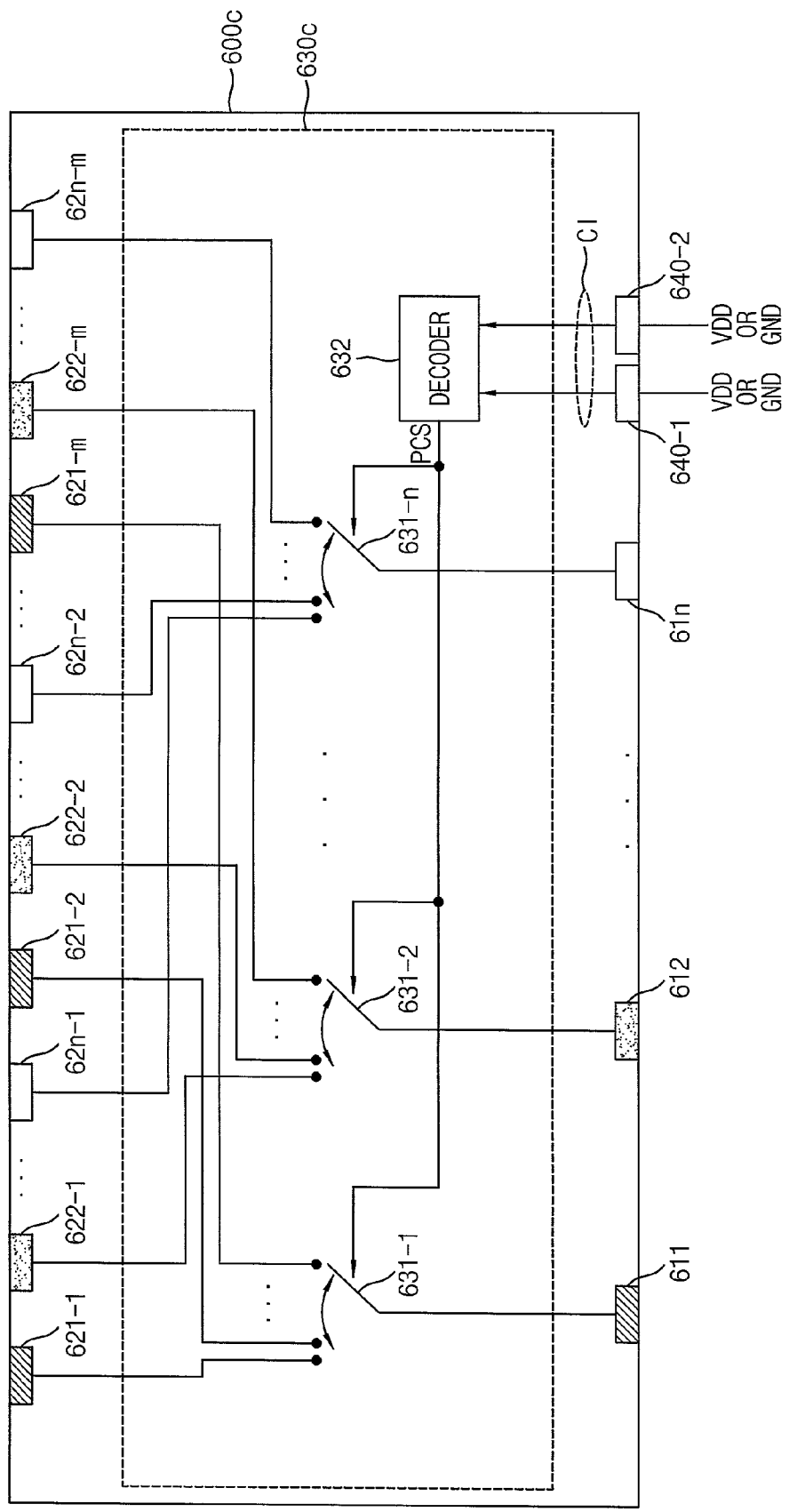
FIG. 9 is a diagram illustrating an example of an interface chip included in the semiconductor package of FIG. 6.

FIG. 9 is a diagram illustrating an example of an interface chip included in the semiconductor package of FIG. 6.

Referring to FIG. 9, an interface chip 600c may first through n-th external interface pads 611, 612, . . . , 61n, a plurality of first through n-th internal interface pads 621-1, 621-2, . . . , 621-m, 622-1, 622-2, . . . , 622-m, . . . , 62n-1, 62n-2, . . . , 62n-m, an interface circuit 630c, and at least one mode pad 640-1 and 640-2.

Although the interface chip 600c is illustrated to include two mode pads 640-1 and 640-2 in FIG. 9, example embodiments are not limited thereto. According to example embodiments, the interface chip 600c may include any number of mode pads.

The interface chip 600c may receive connection information CI, which represents which pads are bonded to the first through n-th signal pads 511, 512, . . . , 51n of the semiconductor chip 500 among the plurality of first through n-th internal interface pads 621-1, 621-2, . . . , 621-m, 622-1, 622-2, . . . , 622-m, . . . , 62n-1, 62n-2, . . . , 62n-m, through the at least one mode pad 640-1 and 640-2.

For example, the connection information CI may correspond to a combination of signals received through the at least one mode pad 640-1 and 640-2.

In some example embodiments, each of the at least one mode pad 640-1 and 640-2 may be coupled to one of a supply voltage VDD and a ground voltage GND. For example, when the interface chip 600c includes two mode pads 640-1 and 640-2, and each of the two mode pads 640-1 and 640-2 is coupled to one of the supply voltage VDD and the ground voltage GND, the connection information CI may correspond to one of "00", "01", "10", and "11". In this case, the number of the plurality of k-th internal interface pads 62k-1, 62k-2, . . . , 62k-m may be four (that is, m=4), and the connection information CI may represent one of four k-th internal interface pads 62k-1, 62k-2, 62k-3, and 62k-4.

The interface circuit 630c may include first through n-th switches 631-1, 631-2, . . . , 631-n and a decoder 632.

The decoder 632 may receive the connection information CI through the at least one mode pad 640-1 and 640-2, and generate a path control signal PCS by decoding the connection information CI.

As illustrated in FIG. 9, since the path control signal PCS generated by the decoder 632 is commonly provided to the first through n-th switches 631-1, 631-2, . . . , 631-n, an order of a selected pad, which is bonded to the i-th signal pad 51i, in the plurality of i-th internal interface pads 62i-1, 62i-2, . . . , 62i-m, may be the same as an order of a selected pad, which is bonded to the j-th signal pad 51j, in the plurality of j-th internal interface pads 62j-1, 62j-2, . . . , 62j-m. Here, i and j represent positive integers equal to or smaller than n, and i and j are different from each other.

The path control signal PCS may represent the selected pad, which corresponds to a pad that is bonded to the k-th signal pad 51k of the semiconductor chip 500 among the plurality of k-th internal interface pads 62k-1, 62k-2, . . . , 62k-m. Therefore, the k-th switch 631-k may selectively connect the k-th external interface pad 61k to the selected pad, which corresponds to the pad that is bonded to the k-th signal pad 51k of the semiconductor chip 500 among the plurality of k-th internal interface pads 62k-1, 62k-2, . . . , 62k-m, based on the path control signal PCS.

Therefore, the first through n-th signal pads 511, 512, . . . , 51n included in the semiconductor chip 500 may be easily connected to the first through n-th external electrodes 401, 402, . . . , 40n, respectively, through the interface chip 600 regardless of an arrangement of the first through n-th signal pads 511, 512, . . . , 51n on the semiconductor chip 500.

In a conventional semiconductor package, pads of a semiconductor chip are directly coupled to external electrodes of a package by wire bonding. Therefore, when a new semiconductor chip, which has an arrangement of pads different from an arrangement of pads of an existing semiconductor chip, is developed, a new package, which has an arrangement of external electrodes that conforms with the arrangement of pads of the new semiconductor chip, is required to be developed.

However, as described above with reference to FIGS. 6 to 9, since the semiconductor package 20 according to example embodiments includes the interface chip 600 that electrically connects the first through n-th signal pads 511, 512, . . . , 51n of the semiconductor chip 500 to the first through n-th external electrodes 401, 402, . . . , 40n, respectively, the first through n-th signal pads 511, 512, . . . , 51n may be easily connected to the first through n-th external electrodes 401, 402, . . . , 40n, respectively, through the interface chip 600 even when the first through n-th signal pads 511, 512, . . . , 51n are located far from the first through n-th external electrodes 401, 402, . . . , 40n, respectively, or it is difficult to directly connect the first through n-th signal pads 511, 512, . . . , 51n to the first through n-th external electrodes 401, 402, . . . , 40n, respectively, by wire bonding. Therefore, even when various kinds of semiconductor chips have different arrangements of pads from each other, the semiconductor chips may be implemented as a package having the same form by the semiconductor package 20 according to example embodiments.

Figure 10:
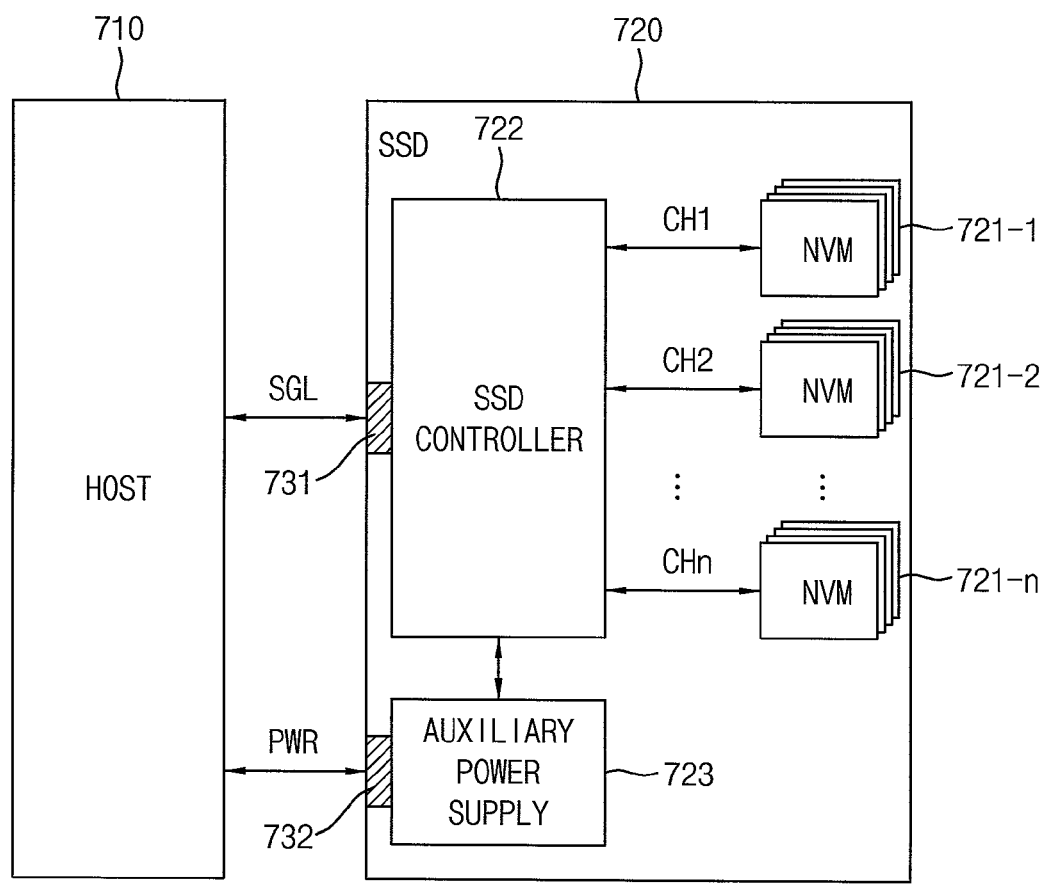
FIG. 10 is a block diagram illustrating a solid state drive (SSD) system according to example embodiments.

FIG. 10 is a block diagram illustrating a solid state drive (SSD) system according to example embodiments.

Referring to FIG. 10, a SSD system 700 includes a host 710 and a SSD 720. The SSD 720 may include a plurality of nonvolatile memory modules 721-1, 721-2, . . . , 721-n and an SSD controller 722.

The plurality of nonvolatile memory modules 721-1, 721-2, . . . , 721-n may be used as a storage medium of the SSD 720. Each of the plurality of nonvolatile memory modules 721-1, 721-2, . . . , 721-n may be implemented with one of the semiconductor package 10 of FIG. 1 and the semiconductor package 20 of FIG. 6. A structure and an operation of the semiconductor package 10 of FIG. 1 and the semiconductor package 20 of FIG. 6 are described above with reference to FIGS. 1 to 9. Therefore, detail description of the plurality of nonvolatile memory modules 721-1, 721-2, . . . , 721-n will be omitted here.

The SSD controller 722 may be coupled to the plurality of nonvolatile memory modules 721-1, 721-2, . . . , 721-n by a plurality of channels CH1, CH2, . . . , CHn, respectively. The SSD controller 722 may exchange a signal SGL with the host 710 through a signal connector 731. The signal SGL may include a command, an address and data. The SSD controller 722 may perform a program operation and a read operation on the plurality of nonvolatile memory modules 721-1, 721-2, . . . , 721-n according to the command received from the host 710.

The SSD 720 may further include an auxiliary power supply 723. The auxiliary power supply 723 may receive power PWR from the host 710 through a power connector 732 and provide power to the SSD controller 722. The auxiliary power supply 723 may be placed inside or outside the SSD 720. For example, the auxiliary power supply 723 may be placed in a main board and provide auxiliary power to the SSD 720.

Figure 11:
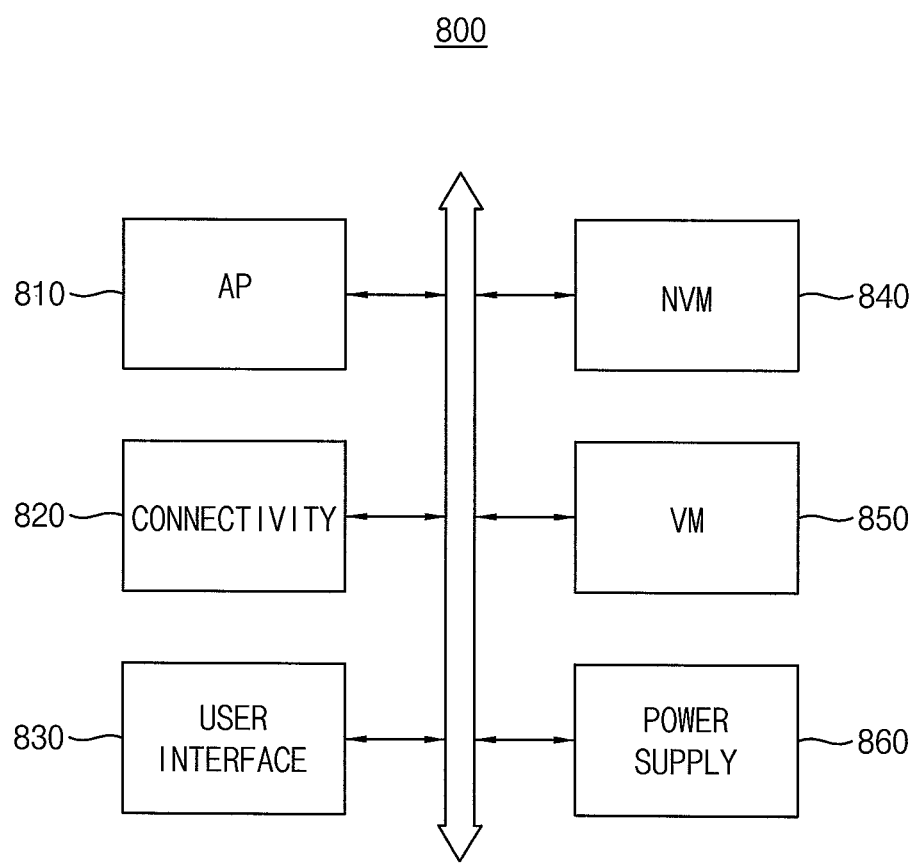
FIG. 11 is a block diagram illustrating an electronic device according to example embodiments.

FIG. 11 is a block diagram illustrating an electronic device according to example embodiments.

Referring to FIG. 11, an electronic device 800 includes an application processor AP 810, a connectivity circuit 820, a user interface 830, a nonvolatile memory module NVM 840, a volatile memory module VM 850, and a power supply 860.

In some embodiments, the electronic device 800 may be a mobile phone, a smart phone, a laptop computer, a personal digital assistant (PDA), a portable multimedia player (PMP), a digital camera, a music player, a portable game console, a navigation system, etc.

The application processor 810 may execute applications, such as a web browser, a game application, a video player, etc. In some example embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity circuit 820 may perform wired or wireless communication with an external device. For example, the connectivity circuit 820 may perform Ethernet communication, near field communication (NFC), radio frequency identification (RFID) communication, mobile telecommunication, memory card communication, universal serial bus (USB) communication, etc. In some embodiments, the connectivity circuit 820 may include a baseband chipset that supports communications, such as global system for mobile communications (GSM), general packet radio service (GPRS), wideband code division multiple access (WCDMA), high speed downlink/uplink packet access (HSxPA), etc.

The nonvolatile memory module 840 may store a boot image for booting the electronic device 800.

The nonvolatile memory module 840 may be implemented with one of the semiconductor package 10 of FIG. 1 and the semiconductor package 20 of FIG. 6. A structure and an operation of the semiconductor package 10 of FIG. 1 and the semiconductor package 20 of FIG. 6 are described above with reference to FIGS. 1 to 9. Therefore, detail description of the nonvolatile memory module 840 will be omitted here.

The volatile memory module 850 may store data processed by the application processor 810, or may operate as a working memory.

The user interface 830 may include at least one input device, such as a keypad, a touch screen, etc., and at least one output device, such as a speaker, a display device, etc.

The power supply 860 may supply a power supply voltage to the electronic device 800.

In some embodiments, the electronic device 800 may further include an image processor, and/or a storage device, such as a memory card, a solid state drive (SSD), a hard disk drive (HDD), a CD-ROM, etc.

In some embodiments, the electronic device 800 and/or components of the electronic device 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor package comprising:
an external electrode;
an interface chip including an external interface pad bonded to the external electrode, a plurality of internal interface pads, and an interface circuit coupled between the external interface pad and the plurality of internal interface pads; and
a semiconductor chip including a signal pad that is selectively bonded to a selected internal interface pad of the plurality of internal interface pads;
wherein the interface circuit is configured to activate a connection between the selected internal interface pad that is bonded to the signal pad and the external interface pad, and deactivate connections between unselected internal interface pads among the plurality of internal interface pads that are not bonded to the signal pad, and the external interface pad, and
wherein the interface circuit comprises
a fuse circuit configured to store connection information that represents which internal interface pad from among the plurality of internal interface pads is selected and bonded to the signal pad,
a decoder configured to generate a path control signal by decoding the connection information read from the fuse circuit, and
a switch configured to connect the external interface pad to the selected internal interface pad based on the path control signal.

2. The semiconductor package of claim 1, wherein the external electrode corresponds to a data input-output electrode through which data are communicated with an external device; and wherein the signal pad corresponds to a data input-output pad of the semiconductor chip that is electrically connected to the data input-output electrode through the interface chip to communicate the data with the external device.

3. The semiconductor package of claim 1, wherein the external electrode corresponds to a clock electrode through which a clock signal is received from an external device; and wherein the signal pad corresponds to a clock pad of the semiconductor chip that is electrically connected to the clock electrode through the interface chip to receive the clock signal from the external device.

4. The semiconductor package of claim 1, wherein the semiconductor chip includes a flash memory device.

5. A semiconductor package, comprising:
first through n-th external electrodes, n being a positive integer;
an interface chip including first through n-th external interface pads respectively bonded to the first through n-th external electrodes, a plurality of first through n-th internal interface pads, and an interface circuit coupled between the first through n-th external interface pads and the plurality of first through n-th internal interface pads; and
a semiconductor chip including first through n-th signal pads, a k-th signal pad from among the first through n-th signal pads being selectively bonded to a selected internal interface pad of a plurality of k-th internal interface pads from among the plurality of first through n-th internal interface pads, k being a positive integer equal to or smaller than n;
wherein the interface circuit is configured to activate a connection between the selected internal interface pad that is bonded to the k-th signal pad and a k-th external interface pad from among the first through n-th external interface pads, and deactivate connections between unselected internal interface pads from among the plurality of k-th internal interface pads that are not bonded to the k-th signal pad, and the k-th external interface pad, and
wherein the interface circuit comprises
a fuse circuit configured to store connection information that represents which internal interface pads from among the plurality of first through n-th internal interface pads are selected and respectively bonded to the first through n-th signal pads,
a decoder configured to generate first through n-th path control signals by decoding the connection information read from the fuse circuit, and
first through n-th switches, a k-th switch from among the first through n-th switches connecting the k-th external interface pad to the selected internal interface pad that is bonded to the k-th signal pad among the plurality of k-th internal interface pads, based on a k-th path control signal from among the first through n-th path control signals.

6. The semiconductor package of claim 5, wherein an arrangement order of the first through n-th external interface pads is the same as an arrangement order of the first through n-th external electrodes to which the first through n-th external interface pads are respectively bonded.

7. The semiconductor package of claim 5, wherein at least one of a plurality of i-th internal interface pads from among the first through n-th internal interface pads is disposed between a plurality of j-th internal interface pads from among the first through n-th internal interface pads, where i and j are positive integers equal to or smaller than n, and i and j are different from each other.

8. An interface chip for use in a semiconductor package having an external electrode and a semiconductor chip, the interface chip comprising:
an external interface pad configured to be bonded to the external electrode;

a plurality of internal interface pads configured to be selectively bonded to a signal pad of the semiconductor chip; and an interface circuit coupled between the external interface pad and the plurality of internal interface pads, the interface circuit configured to activate a connection between a selected internal interface pad from among the plurality of internal interface pads that is to be bonded to the signal pad, and the external interface pad, and configured to deactivate connections between unselected internal interface pads from among the plurality of internal interface pads that are not to be bonded to the signal pad, and the external interface pad, wherein the interface circuit comprises a fuse circuit configured to store connection information that represents which internal interface pad from among the plurality of internal interface pads is to be selected and bonded to the signal pad, a decoder configured to generate a path control signal by decoding the connection information read from the fuse circuit, and a switch configured to connect the external interface pad to the selected internal interface pad based on the path control signal.

* * * * *